(12) United States Patent
Peng et al.

(10) Patent No.: US 9,607,960 B1
(45) Date of Patent: Mar. 28, 2017

(54) BONDING STRUCTURE AND FLEXIBLE DEVICE

(71) Applicant: Industrial Technology Research Institute, Hsinchu (TW)

(72) Inventors: Yi-Cheng Peng, Taoyuan (TW); Ming-Hua Yeh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/983,506

(22) Filed: Dec. 29, 2015

(30) Foreign Application Priority Data

Dec. 14, 2015 (TW) .................................. 104141996

(51) Int. Cl.
*H01L 23/00* (2006.01)
*H01L 23/498* (2006.01)
*H01L 23/48* (2006.01)

(52) U.S. Cl.
CPC ............ *H01L 24/32* (2013.01); *H01L 23/481* (2013.01); *H01L 23/4985* (2013.01); *H01L 2224/05017* (2013.01); *H01L 2224/29005* (2013.01); *H01L 2224/29082* (2013.01); *H01L 2224/29198* (2013.01); *H01L 2224/32225* (2013.01)

(58) Field of Classification Search
CPC ........................................... H01L 2224/48247
USPC ......................................... 257/774; 438/612
See application file for complete search history.

(56) References Cited

U.S. PATENT DOCUMENTS

| 7,023,095 | B2 | 4/2006 | Lee et al. |
| 7,038,327 | B2 | 5/2006 | Ho et al. |
| 7,561,242 | B2 | 7/2009 | Hirakata et al. |
| 7,916,262 | B2 | 3/2011 | Liu et al. |
| 8,493,538 | B2 | 7/2013 | Lu et al. |

(Continued)

FOREIGN PATENT DOCUMENTS

| CN | 1848394 | 10/2006 |
| CN | 201910415 | 7/2011 |

(Continued)

OTHER PUBLICATIONS

Ming-Sian Lyu, "ACF Nonlinear Material Properties in the Mechanical Analysis of Au Bump Bonding Process," Master Thesis, National Cheng Kung University, Department of Engineering Science, Jun. 2005, pp. 1-123.

(Continued)

*Primary Examiner* — Dung Le
(74) *Attorney, Agent, or Firm* — Jianq Chyun IP Office

(57) ABSTRACT

A bonding structure comprising a contact pad, an anisotropic conductive film (ACF) and a contact structure is provided. The contact pad includes at least one recess, wherein a thickness of the contact pad is T, and a width of the at least one recess is B, The ACF is disposed on the contact pad and includes a plurality of conductive particles; each of the conductive particles is disposed in the at least one recess. A diameter of the conductive particles is A, and A is larger than B and T and satisfies B≤2(AT−T²)^{1/2}. The contact structure is disposed on the ACF and electrically connected to the contact pad via the conductive particles. The disclosure also provides a flexible device including a substrate, a patterned insulating layer, at least one contact pad, ACF, and a contact structure.

14 Claims, 9 Drawing Sheets

(56) References Cited

U.S. PATENT DOCUMENTS

| | | | |
|---|---|---|---|
| 2004/0229398 A1* | 11/2004 | Magerlein | H01L 21/486 438/106 |
| 2006/0072060 A1 | 4/2006 | Lu et al. | |
| 2008/0188040 A1* | 8/2008 | Ozawa | H01L 21/4853 438/125 |
| 2009/0153453 A1 | 6/2009 | Lu et al. | |
| 2014/0029219 A1* | 1/2014 | Oh | H05K 7/06 361/760 |
| 2015/0001725 A1* | 1/2015 | Hu | H01L 25/50 257/762 |
| 2015/0145130 A1* | 5/2015 | Lin | H01L 23/49838 257/738 |

FOREIGN PATENT DOCUMENTS

| | | |
|---|---|---|
| CN | 103491703 | 1/2014 |
| CN | 103578357 | 2/2014 |
| TW | I492357 | 7/2015 |

OTHER PUBLICATIONS

Y-Lin Chen, "Correlation Between the Viscoelastic Properties of Anisotropic Conductive Adhesive and Reliability of Chip-on-Flex," Master Thesis, National Cheng Kung University, Department of Power Mechanical Engineering, Jul. 2009, pp. 1-101.
"Office Action of Taiwan Counterpart Application", issued on May 26, 2016, p. 1-p. 8.

* cited by examiner

BONDING STRUCTURE AND FLEXIBLE DEVICE

CROSS-REFERENCE TO RELATED APPLICATION

This application claims the priority benefit of Taiwan application serial no. 104141996, filed on Dec. 14, 2015. The entirety of the above-mentioned patent application is hereby incorporated by reference herein and made a part of this specification.

TECHNICAL FIELD

The present disclosure relates to a bonding structure and a flexible device.

BACKGROUND

An anisotropic conductive film (ACF) refers to a thin film having unidirectional conductive property, and a material of the ACF is generally formed of conductive particles and insulating resin. The ACF is mainly applied to a process where conducting lead-tin soldering through high temperature is not possible, for example, the manufacturing process of liquid crystal display panel as well as transmission and connection of IC-driving signals. In a manufacturing process of a flexible panel module, the ACF is often utilized for bonding panel elements. However, in conventional flexible panels, since the area of the conductive particles in the ACF that contacts the panel element is small, the bonding reliability between the panel elements becomes lower. In a flexible device, due to size change or deformation of the panel, a problem will arise where the pressing/bonding of the elements become difficult. Therefore, how to enhance the reliability and flexibility in current methods for pressing panel elements is a topic being actively researched.

SUMMARY

In one embodiment of the present disclosure, a bonding structure is provided which may enhance the reliability and flexibility in the process of pressing panel elements.

In one of exemplary embodiments, the bonding structure comprises a contact pad, an anisotropic conductive film (ACF) and a contact structure. The contact pad has at least one recess, wherein a thickness of the contact pad is T and a width of the at least one recess is B. The ACF is disposed on the contact pad and comprises a plurality of conductive particles. Each conductive particle is disposed in the at least one recess, wherein the diameter of each conductive particle is A, A is larger than B and T, and satisfies $B \leq 2(AT-T^2)^{1/2}$ The contact structure is disposed on the ACF and electrically connected to the contact pad via the conductive particles.

In one embodiment of the present disclosure a flexible device is also provided which may enhance the reliability and flexibility in pressing the panel elements.

In one of exemplary embodiments, the flexible device comprises a substrate, a patterned insulating layer, at least one contact pad, an anisotropic conductive film (ACF) and a contact structure. The substrate includes a bonding region and a wire region. The patterned insulating layer is disposed on the substrate and disposed in the bonding region. The at least one contact pad covers the patterned insulating layer such that a surface of the at least one contact pad comprises at least one recess. The ACF is disposed on the at least one contact pad and comprises a plurality of conductive particles. Each conductive particle is disposed in the at least one recess. The contact structure is disposed on the ACF and electrically connected to the contact pad via the conductive particles.

Based on the above, the contact pad of the bonding structure and flexible device in the exemplary embodiments comprises at least one recess, and the conductive particles are disposed in the recess. Therefore, when the panel elements are bonded to one another via the conductive particles, the 3D pattern of the recess enables the contact point or contact area to increase, such that a favorable reliability and flexibility in pressing the panel elements can be attained.

To provide a better understanding to the present disclosure, several exemplary embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
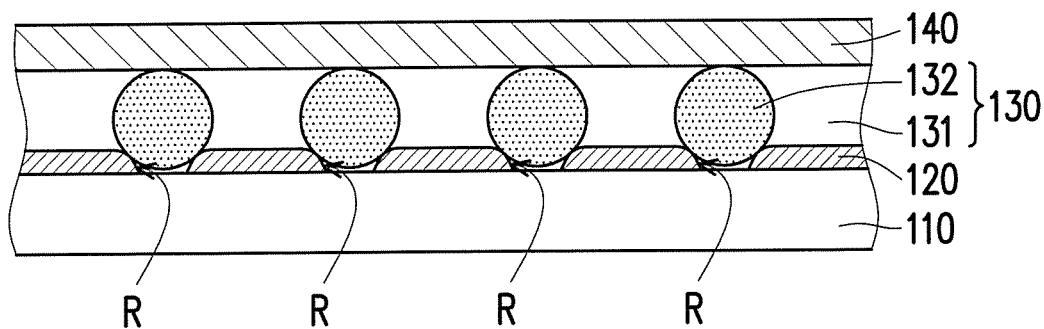
FIG. 1A is a sectional view illustrating a bonding structure according to an embodiment of the disclosure.
Figure 1B:
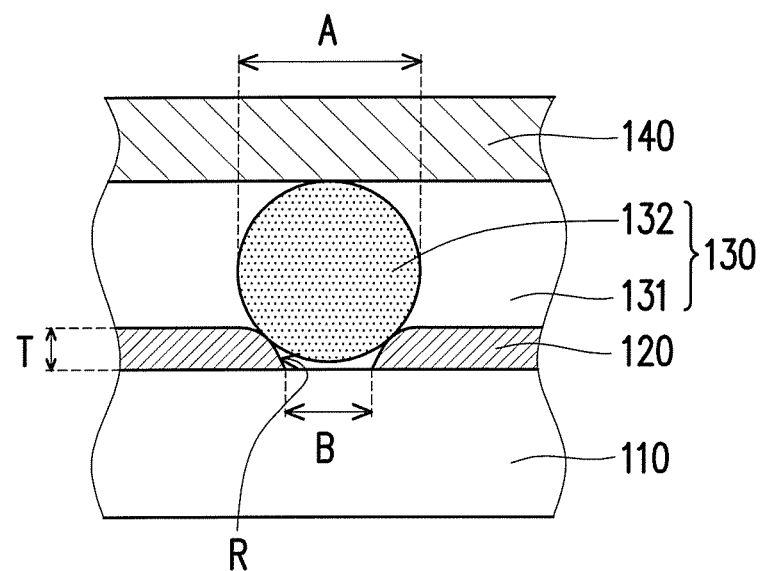
FIG. 1B is a partially enlarged view of the sectional view of FIG. 1A.

FIG. 1A is a sectional view illustrating a bonding structure according to an embodiment of the disclosure. FIG. 1B is a partially enlarged view of the sectional view of FIG. 1A. Referring to both FIG. 1A and FIG. 1B, a bonding structure of the present embodiment includes a contact pad 120, an anisotropic conductive film (ACF) 130 and a contact structure 140. The bonding structure is disposed on a substrate 110. The material of the substrate 110 may be glass, quartz, organic polymer or non-transparent/reflective material (e.g. conductive material, metal, wafer, ceramic, plastic (PI, PET) or other suitable materials), or other suitable materials. In the case where conductive material or metal is used, the substrate 110 is covered with an insulating layer (not shown) to avoid the issue of short-circuit.

The contact pad 120 is disposed on the substrate 110, and the contact pad 120 is formed of a conductive material for outputting or receiving an electronic signal. The material of the contact pad 120 includes a single-layered or multiple-layered conductive material or conductive metal (e.g.

molybdenum-aluminum-molybdenum, titanium-aluminum-titanium or conductive ceramic (ITO, IZO) material), or a combination thereof. The contact pad 120 has at least one recess R, wherein a thickness of the contact pad 120 is T and a width of the at least one recess R is B. The ACF 130 is disposed on the contact pad 120. The ACF 130 includes an insulator 131 and a plurality of conductive particles 132 within the insulator 131. Herein, the insulator 131 may be a thermosetting material or a thermoplastic polymer material. The conductive particles 132 include particles made by organic/inorganic composite material such as polymer, nickel and gold, however, the disclosure is not limited thereto. In the ACF 130, each of the conductive particles 132 is disposed in the at least one recess R, and the diameter of each conductive particle 132 is A. In the embodiment, the diameter A of the conductive particles 132 is larger than the width B of the recess R and thickness T of the contact pad 120, and satisfies $B \leq 2(AT-T^2)^{1/2}$. Under the premise where the width B of the recess R and the thickness T of the contact pad 120 satisfy the above condition, the width B of the recess R and the thickness T of the contact pad 120 may be adjusted according to the size of the diameter A of the conductive particles 132.

The contact structure 140 is disposed on the ACF 130 and electrically connected to the contact pad 120 via the conductive particles 132. In the embodiment, the contact structure 140 is a conductive material that is, for example, connected with a chip. The chip is a diode, an insulated gate bipolar transistor (IGBT), a metal oxide semiconductor field effect transistor (MOSFET) or other semiconductor elements, but the disclosure is not limited thereto.

In the embodiments illustrated by FIGS. 1A to 1B, the conductive particles 132 are disposed in the at least one recess R of the contact pad 120, and a proportion of the diameter A of the conductive particles 132, the width B of the recess R and thickness T of the contact pad 120 satisfies the above condition. In this manner, in the bonding structure of the embodiment, the contact point or contact area where the conductive particles 132 contact the contact pad 120 can be increased. In other words, with the recess R of the contact pad 120 that has a 3D-pattern design, an effective contact section for the conductive particles 132 in the ACF 130 can be increased for pressing the panel elements. Therefore, a favorable reliability and flexibility for pressing can be attained. In other words, the bonding structure in the embodiment of the disclosure may improve the conductive reliability between the panel elements and reduce contact resistance to avoid the occurrence of noise.

The above embodiments mainly describe that the contact pad 120 comprises at least one recess R. In the following paragraphs, different embodiments concerning the position and types of patterns of the at least one recess R are described in detail below.

Figure 2A:
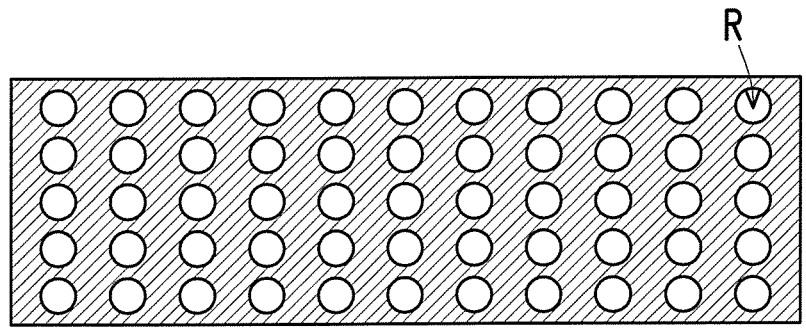
FIGS. 2A to 2C are top views illustrating a contact pad according to an embodiment of the disclosure.
Figure 2B:
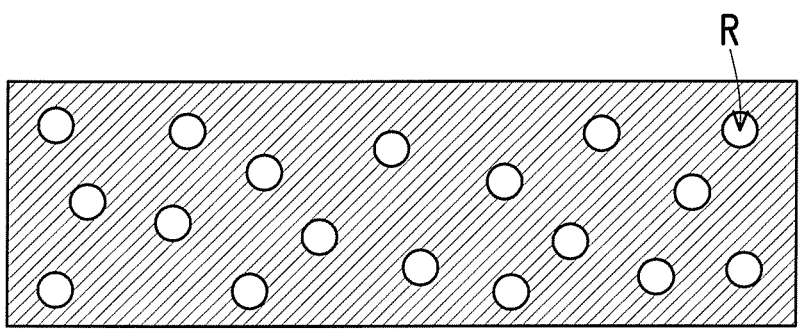
Figure 2C:
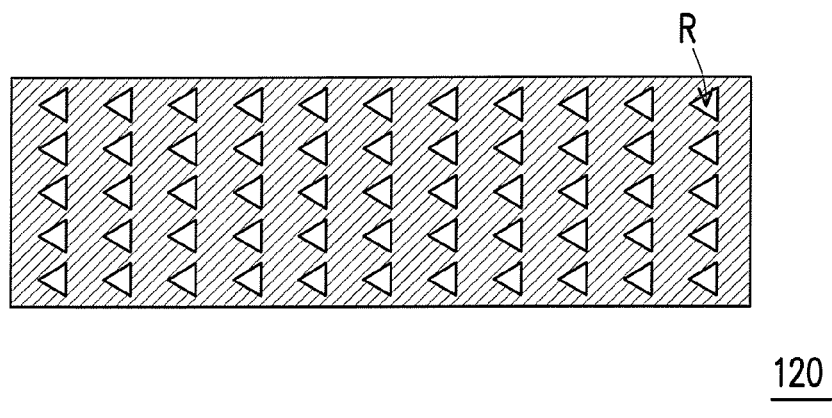

FIGS. 2A to 2C are top views illustrating a contact pad according to an embodiment of the disclosure. Referring to FIG. 2A, the recess R in the contact pad 120 has an aperture pattern, and the aperture pattern is a round aperture. As shown by FIG. 2A, the recess R having the aperture pattern is arranged in an array on the contact pad 120, however, the disclosure is not limited thereto. For example, as shown by FIG. 2B, the recess R having the aperture pattern is a round aperture and distributed irregularly on the contact pad 120. Meanwhile, in the embodiment illustrated by FIG. 2C, the recess R in the contact pad 120 has an aperture pattern, and the aperture pattern is a triangular aperture arranged in an array on the contact pad 120. The embodiment provided no limitation to the arrangement and shape of the recess R having the aperture pattern. For instance, the aperture pattern may be a polygonal aperture but it still needs to meet the requirement for the width B of the recess R as described above, and its proportional relationship maybe referred to FIG. 1B. In this manner, a favorable contact area for the conductive particles 132 contacting the contact pad 120 can be attained.

Figure 3A:
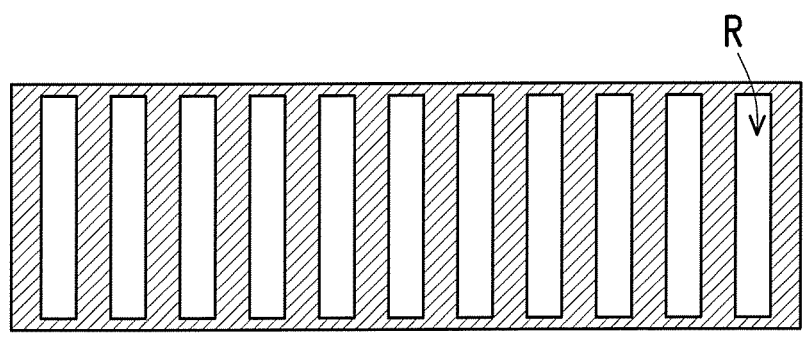
FIGS. 3A to 3C are top views illustrating a contact pad according to another embodiment of the disclosure.
Figure 3B:
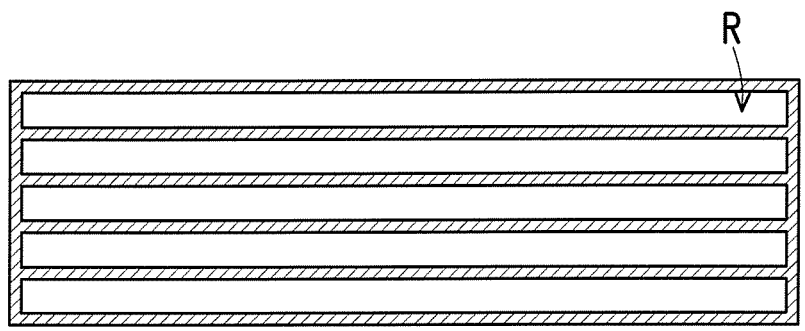
Figure 3C:
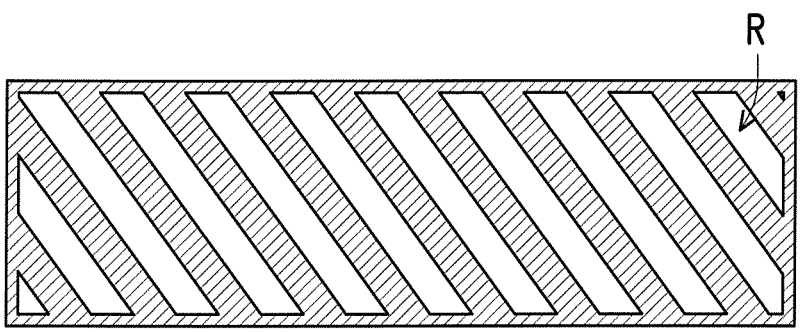

FIGS. 3A to 3C are top views illustrating a contact pad according to another embodiment of the disclosure. Referring to FIGS. 3A to 3C, a recess R in the contact pad 120 has a striped pattern. As shown by FIG. 3A, the recess R having the striped pattern is arranged vertically on the contact pad 120, however, the disclosure is not limited thereto. For example, as shown by FIG. 3B, the recess R having the striped pattern is arranged horizontally on the contact pad 120. In addition, as shown by FIG. 3C, the recess R having the striped pattern is arranged obliquely on the contact pad 120. In the embodiments illustrated by FIGS. 3A to 3C, the conductive particles 132 may be disposed in each recess R having the striped pattern. However, the width B of the recess R having the striped pattern still needs to meet the requirement described above, and the proportional relationship between the width B and the conductive particles 132 can be referred to FIG. 1B.

FIG. 2A to FIG. 2C and FIGS. 3A to 3C show that the disclosure provides no limitation to the position and pattern of the recess R on the contact pad 120. The position and pattern of the recess R may be adjusted depending on the needs. Nevertheless, the design of the recess R still has to meet the above requirements so as to increase the contact area, and to achieve a favorable reliability and flexibility in pressing the panel elements.

Figure 4:
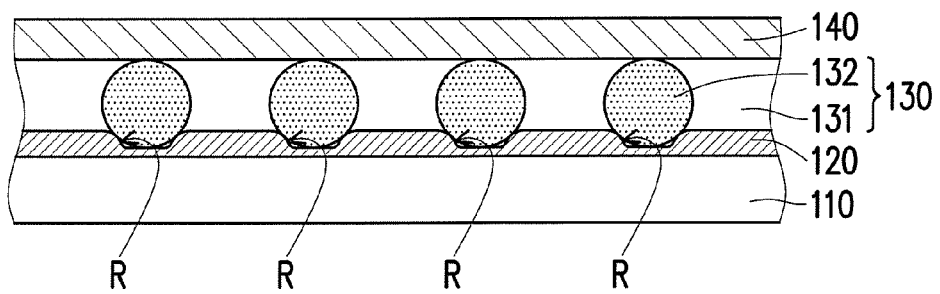
FIG. 4 is a sectional view illustrating a bonding structure according to another embodiment of the disclosure.

In the above embodiments, the at least one recess R has a through-hole structure. In other words, the recess R penetrates through the entire contact pad 120 to expose a surface below the contact pad 120. However, the disclosure is not limited thereto. FIG. 4 is a sectional view illustrating a bonding structure according to another embodiment of the disclosure. The bonding structure in the embodiment of FIG. 4 is similar to the embodiment of FIG. 1A, therefore, the same elements are denoted by the same reference numerals. The main difference between FIG. 4 and FIG. 1A lies in that the at least one recess R of the contact pad 120 in FIG. 4 is not a through hole structure. In the embodiment of FIG. 4, the at least one recess R of the contact pad 120 is a blind via structure. That is to say, the recess R does not penetrates through the entire contact pad 120 but is merely extended into the contact pad 120. Likewise, the design of the recess R in the embodiment still has to meet the above requirement so as to acquire an increased contact area, and to achieve a favorable reliability and flexibility in pressing the panel elements.

Figure 5A:
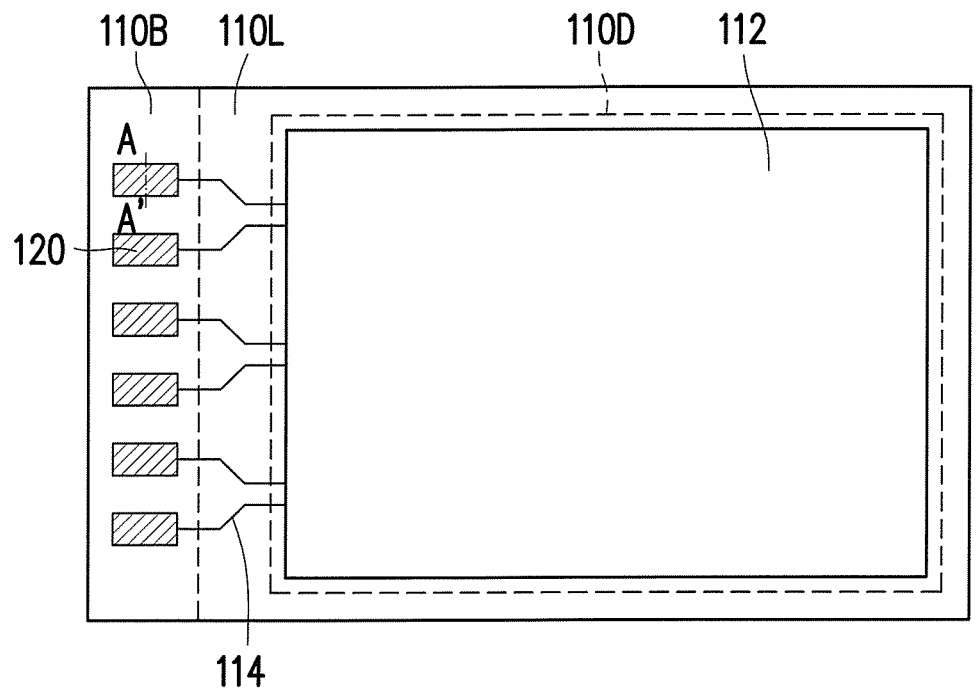
FIGS. 5A to 5B are top views illustrating a flexible device according to an embodiment of the disclosure.
Figure 5B:
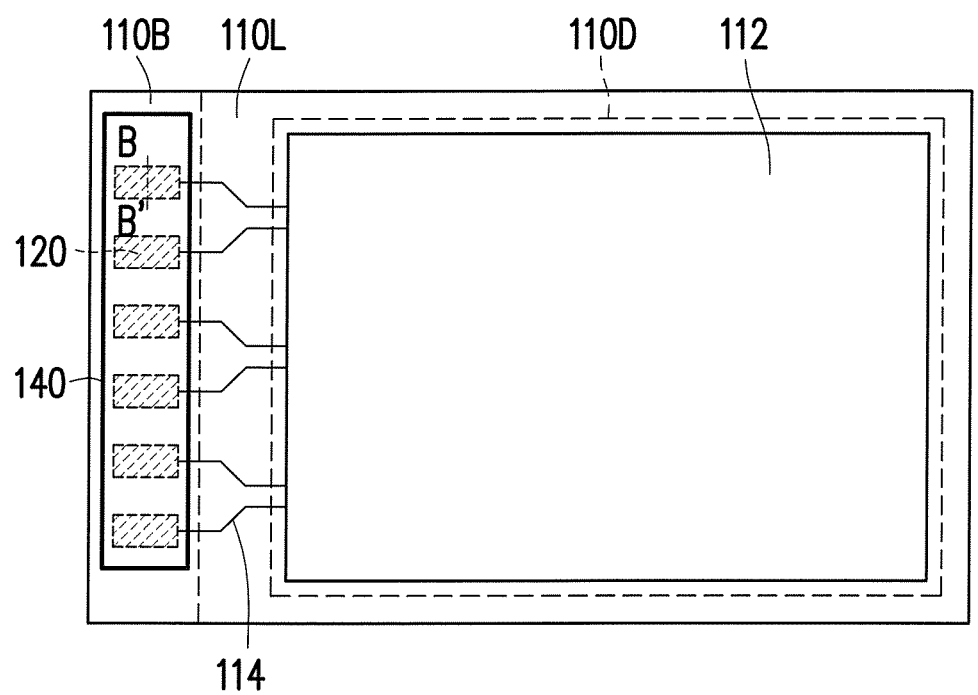
Figure 6A:
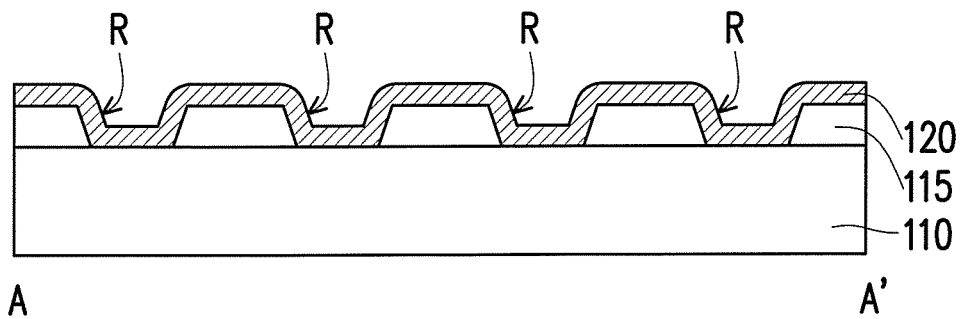
FIG. 6A is a sectional view taken along line A-A' in FIG. 5A.
Figure 6B:
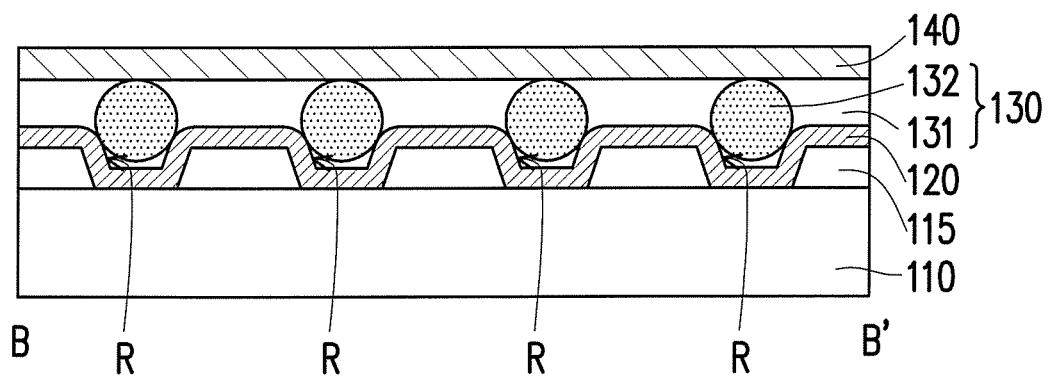
FIG. 6B is a sectional view taken along line B-B' in FIG. 5B.

FIGS. 5A to 5B are top views illustrating a flexible device according to an embodiment of the disclosure. The flexible device may be a flexible electronic device such as a flexible display. FIG. 6A is a sectional view taken along line A-A' in FIG. 5A. FIG. 6B is a sectional view taken along line B-B' in FIG. 5B. Referring to FIGS. 5A, 5B, 6A and 6B, the embodiment is described based on a flexible device having a display panel as an example. However, the disclosure is not limited thereto. It is also possible that the flexible device does not include a display panel. In the embodiment, the flexible device includes a substrate 110, a patterned insulating layer 115, at least one contact pad 120, an ACF 130 and a contact structure 140. The material of the substrate 110 may be glass, quartz, organic polymer or non-transparent/reflective material (e.g. conductive material, metal, wafer, ceramic, plastic (PI, PET) or other suitable materials), or other suitable materials. In the case where conductive material or metal is used, the substrate 110 is covered with an insulating layer (not shown) to avoid the issue of short-circuit.

The substrate 110 includes a bonding region 110B, a wire region 110L and an active region 110D. In the case where the flexible device does not include a display panel, the substrate 110 does not include the active region 110D. In the embodiment, the active region 110D includes a plurality of display elements 112. The display elements 112 may include a plurality of active elements and pixel structures that can provide an image display in the active region 110D. The patterned insulating layer 115 is disposed on the substrate 110 and in the bonding region 110B. The material of the patterned insulating layer 115 is, for example, an oxide material such as $SiO_x$ or $SiO_2$, or a photoresist material, but is not limited thereto. The patterned insulating layer 115 may serve as a stress modulating layer for inhibiting the panel from being expanded/shrunk or warped during the pressing of the panel elements.

In addition, the bonding region 110B further includes at least one contact pad 120, wherein the at least one contact pad 120 covers the patterned insulating layer 120 such that a surface of the at least one contact pad 120 has at least one recess R. In one embodiment, the at least one contact pad 120 covers the patterned insulating layer 120 conformably. Please refer to the above embodiments for the definition of the at least one recess R, and its description thereof is not repeated herein. In the embodiment, the contact pad 120 is a conductive material and may be used for outputting or receiving an electronic signal. The contact pad 120 may be respectively electrically connected to a corresponding transmitting wire 114 in the wire region 110L, and electrically connected to a display element 112 in the active region 110D via the transmitting wire 114.

Next, referring to FIGS. 5B and 6B, the ACF 130 is disposed on the contact pad 120. The ACF 130 includes an insulator 131 and a plurality of conductive particles 132 in the insulator 131. Here, the insulator 131 may be a thermosetting or thermoplastic polymer material. Each conductive particle 132 in the ACF 130 is disposed in the at least one recess R. In the embodiment, the requirement for the diameter of the conductive particles 132, the width of the recess R and the thickness of the contact pad 120 is the same as the requirement described in the embodiment of FIG. 1B. Furthermore, the contact structure 140 is disposed on the ACF 130 and electrically connected to the contact pad 120 via the conductive particles 132.

In the embodiment, the contact structure 140 is a conductive material and is also connected to a chip of power elements such as diode, an insulated gate bipolar transistor (IGBT), or a metal oxide semiconductor field effect transistor (MOSFET). When the contact structure 140 is electrically connected to the contact pad 120 via the conductive particles 132, the contact pad 120 is configured for outputting or receiving an electrical signal of the power elements, and can drive the display element 112 in the active region 110D via the transmitting wire 114 in the wire region 110L to provide an image display.

In the embodiments described by FIGS. 5A, 5B, 6A and 6B, the patterned insulating layer 115 may serve as a stress modulating layer, and the contact pad 120 covers the patterned insulating layer 115. In one embodiment, the at least one contact pad 120 covers the patterned insulating layer 120 conformably. Meanwhile, the conductive particles 132 are disposed in the at least one recess R of the contact pad 120. In this manner, the contact point or contact area where the conductive particles 132 are contacting the contact pad 120 in the flexible device of the embodiment can be increased. In other words, with the patterned insulating layer 115 that make the recess R of the contact pad 120 to have a 3D-pattern design, an effective contact section for the conductive particles 132 in the ACF 130 can be increased during the pressing of the panel elements, and a favorable reliability and flexibility in pressing the panel elements can be attained. In other words, the flexible device in the embodiment of the disclosure may improve the conductive reliability between the panel elements and reduce contact resistance to avoid occurrence of noise.

Figure 7:
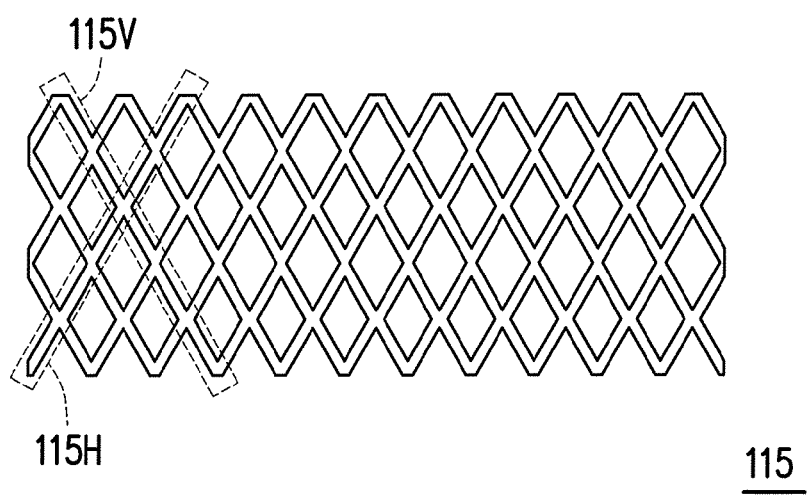
FIG. 7 is a top view illustrating a patterned insulating layer according to an embodiment of the disclosure.

The above embodiments mainly describe that the contact pad 120 may conformably covers the patterned insulating layer 115. However, the design of the patterned insulating layer 115 is not particularly limited. FIG. 7 is a top view illustrating a patterned insulating layer according to an embodiment of the disclosure. Referring to FIG. 7, in the embodiment, the patterned insulating layer 115 has a 3D mesh pattern, and the 3D mesh pattern includes a plurality of vertical portions 115V and a plurality of horizontal portions 115H. The vertical portions 115V and horizontal portions 115H are staggered to constitute the 3D mesh pattern. Since the patterned insulating layer 115 has the 3D mesh pattern, the contact pad 120 that covers the patterned insulating layer 115 also has the same 3D pattern design. Such design allows the effective contact section where the conductive particles 132 of the ACF 130 is contacting the contact pad 120 to be increased during pressing of the panel elements, such that a favorable reliability and flexibility in pressing the panel elements can be attained.

Figure 8A:
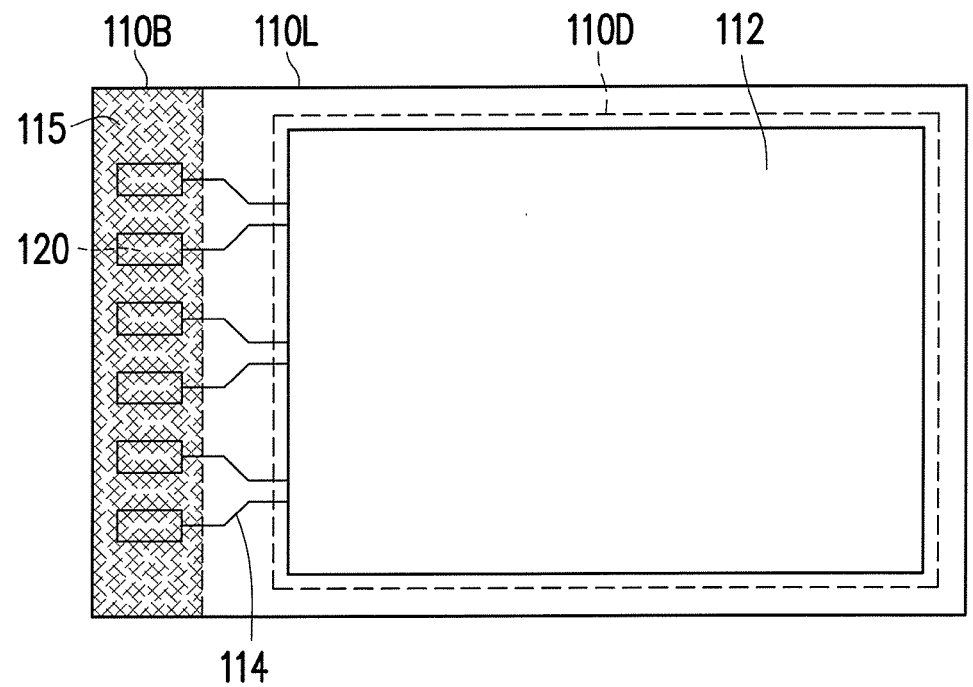
FIG. 8A is a top view illustrating a flexible device according to an embodiment of the disclosure.
Figure 8B:
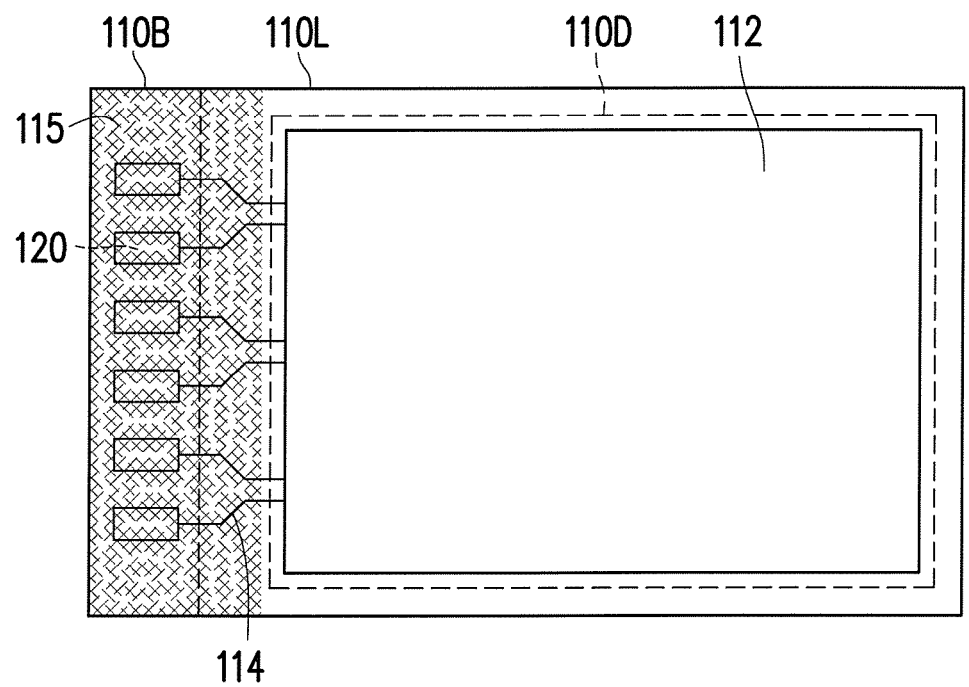
FIG. 8B is a top view illustrating a flexible device according to another embodiment of the disclosure.

FIG. 8A is a top view illustrating a flexible device according to an embodiment of the disclosure. In the embodiment, the entire patterned insulating layer 115 may be a 3D mesh pattern, and the patterned insulating layer 115 is disposed in the bonding region 110B only. In this manner, when the patterned insulating layer 115 is covered by the contact pad 120, the contact pad 120 can have a 3D pattern design such that the contact particles 132 are located in the recess R of the contact pad 120. However, the present disclosure is not limited thereto. In other embodiments, the distribution position of the patterned insulating layer 115 may be changed. FIG. 8B is a top view illustrating a flexible device according to another embodiment of the disclosure. In the embodiment, the patterned insulating layer 115 is disposed in the bonding region 110B, and the patterned insulating layer 115 is further extended into the wire region 110L. Likewise, when the patterned insulating layer 115 is covered by the contact pad 120, the contact pad 120 can have a 3D pattern design such that the conductive particles 132 are located in the recess R of the contact pad 120. The above embodiments show that the disclosure provides no limitation to the distribution position of the patterned insulating layer 115 as long as the patterned insulating layer 115 is disposed under the contact pad 120. In the meantime, the patterned insulating layer 115 may be disposed in the whole bonding region 110B and wire region 110L depending on the requirements.

Based on the above, in the embodiments of the disclosure, the conductive particles 132 of the bonding structure are disposed in the at least one recess R of the contact pad 120, and the proportion of the diameter A of the conductive particles 132, the width B of the recess R and the thickness T of the contact pad 120 meet a specific requirement. In this manner, in the bonding structure of the embodiments of the disclosure, the contact point or contact area where the conductive particles 132 are contacting the contact pad 120 can be increased and favorable reliability and flexibility during pressing can be attained. Likewise, the patterned insulating layer 115 of the flexible device in the disclosure may serve as a stress modulating layer, and the contact pad 120 may conformably covers the patterned insulating layer 115. Also, the conductive particles 132 are disposed in the at least one recess R of the contact pad 120. In this manner, in the flexible device of the disclosure, the contact point or contact area where the conductive particles 132 are contacting the contact pad 120 can be increased, such that a favorable reliability and flexibility in pressing the panel elements can be attained.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A bonding structure, comprising:
    a contact pad, comprising at least one recess, wherein a thickness of the contact pad is T and a width of the at least one recess is B;
    an anisotropic conductive film, disposed on the contact pad and comprising a plurality of conductive particles, each of the conductive particles is disposed in the at least one recess, wherein a diameter of each of the conductive particles is A, and A is larger than B and T, and satisfies $B \leq 2(AT-T^2)^{1/2}$; and
    a contact structure, disposed on the anisotropic conductive film and electrically connected to the contact pad via the conductive particles.

2. The bonding structure according to claim 1, wherein the anisotropic conductive film further comprises an insulator, the plurality of conductive particles are disposed within the insulator.

3. The bonding structure according to claim 1, wherein the at least one recess has an aperture pattern.

4. The bonding structure according to claim 3, wherein the aperture pattern is a round aperture, a triangular aperture or a polygonal aperture.

5. The bonding structure according to claim 3, wherein the aperture pattern is arranged in an array on the contact pad.

6. The bonding structure according to claim 3, wherein the aperture pattern is distributed irregularly on the contact pad.

7. The bonding structure according to claim 1, wherein the at least one recess has a striped pattern.

8. The bonding structure according to claim 1, wherein the at least one recess is a through hole structure or a blind via structure.

9. A flexible device, comprising:
    a substrate, comprising a bonding region and a wire region;
    a patterned insulating layer, disposed on the substrate and located in the bonding region;
    at least one contact pad, covering the patterned insulating layer such that a surface of the at least one contact pad comprises at least one recess;
    an anisotropic conductive film, disposed on the at least one contact pad and comprising a plurality of conductive particles, each of the conductive particles disposed in the at least one recess, wherein a thickness of the contact pad is T, a width of the at least one recess is B, and a diameter of each of the conductive particles is A, wherein A is larger than B and T and satisfies $B \leq 2(AT-T^2)^{1/2}$; and
    a contact structure, disposed on the anisotropic conductive film and connected to the contact pad via the conductive particles.

10. The flexible device according to claim 9, wherein the anisotropic conductive film further comprises an insulator, the plurality of conductive particles are disposed within the insulator.

11. The flexible device according to claim 9, wherein the patterned insulating layer comprises a 3D mesh pattern.

12. The flexible device according to claim 11, wherein the 3D mesh pattern comprises a plurality of vertical portions and a plurality of horizontal portions, the vertical portions and the horizontal portions are staggered to constitute the 3D mesh pattern.

13. The flexible device according to claim 11, wherein the patterned insulating layer is further extended into the wire region.

14. The flexible device according to claim 11, wherein a material of the 3D mesh pattern comprises a photoresist material or an oxide material.

* * * * *